United States Patent
Wolfer et al.

(10) Patent No.: US 8,957,704 B1
(45) Date of Patent: Feb. 17, 2015

(54) HIGH SPEED PHASE SELECTOR WITH A GLITCHLESS OUTPUT USED IN PHASE LOCKED LOOP APPLICATIONS

(71) Applicant: Synopsys, Inc., Mountain View, CA (US)

(72) Inventors: Skye Wolfer, Hillsboro, OR (US); David A. Yokoyama-Martin, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/020,229

(22) Filed: Sep. 6, 2013

(51) Int. Cl.
*H03K 17/00* (2006.01)
*H03K 5/125* (2006.01)

(52) U.S. Cl.
CPC ...................................... *H03K 5/125* (2013.01)
USPC .................................. 327/2; 327/99; 327/298

(58) Field of Classification Search
CPC .......... H03K 5/13; H03K 5/131; H03K 5/135
USPC ...................................... 327/2, 3, 12, 99, 298
See application file for complete search history.

(56) References Cited

U.S. PATENT DOCUMENTS

| | | | |
|---|---|---|---|
| 6,229,344 B1 * | 5/2001 | Warwar | 327/3 |
| 6,803,796 B2 * | 10/2004 | Huang et al. | 327/99 |
| 6,960,942 B2 * | 11/2005 | Ghaderi et al. | 327/99 |
| 7,081,777 B2 * | 7/2006 | Huang et al. | 327/99 |
| 7,911,239 B2 * | 3/2011 | Saint-Laurent et al. | 327/99 |
| 8,222,941 B2 * | 7/2012 | Fan et al. | 327/161 |
| 8,653,862 B2 * | 2/2014 | Lin | 327/115 |
| 2012/0027144 A1 * | 2/2012 | Chiang | 375/354 |

OTHER PUBLICATIONS

Hanumola, P. et al., "A Wide Tracking Range Clock and Data Recovery Circuit," IEEE Journal of Solid State Circuits, Feb. 2008, pp. 425-439, vol. 43, No. 2.
Hanumola, P. et al., "A Sub-Picosecond Resolution of 0.5-1.5 GHz Digital-to-Phase Converter," IEEE Journal of Solid State Circuits, Feb. 2008, pp. 414-424, vol. 43, No. 2.

* cited by examiner

*Primary Examiner* — William Hernandez
(74) *Attorney, Agent, or Firm* — Fenwick & West LLP

(57) ABSTRACT

A digital phase selector circuit that switches an output clock between N input clock phases is described. The phase selector utilizes a special output mux and switches clock phases during a safe zone to avoid glitches. The phase selector is used in the feedback path of a PLL to implement functions such as spread spectrum or fractional reference clocks. An example with N=4 and an optimized latch mux is shown.

14 Claims, 8 Drawing Sheets

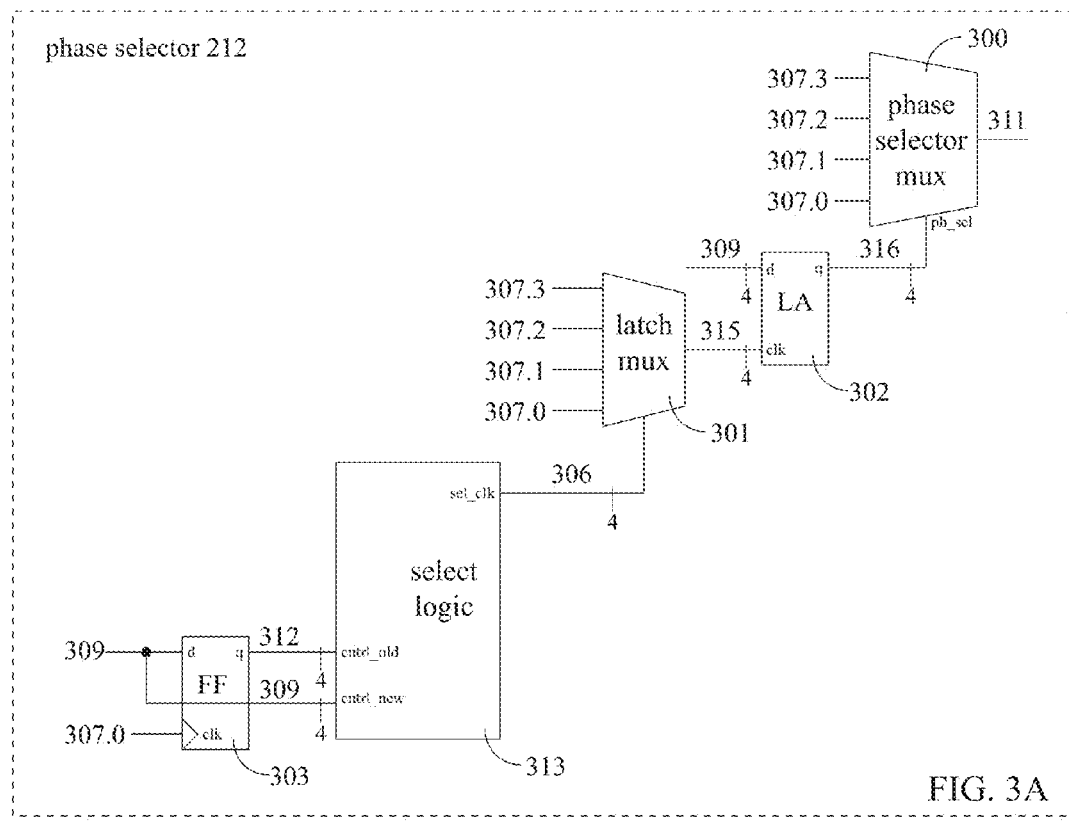
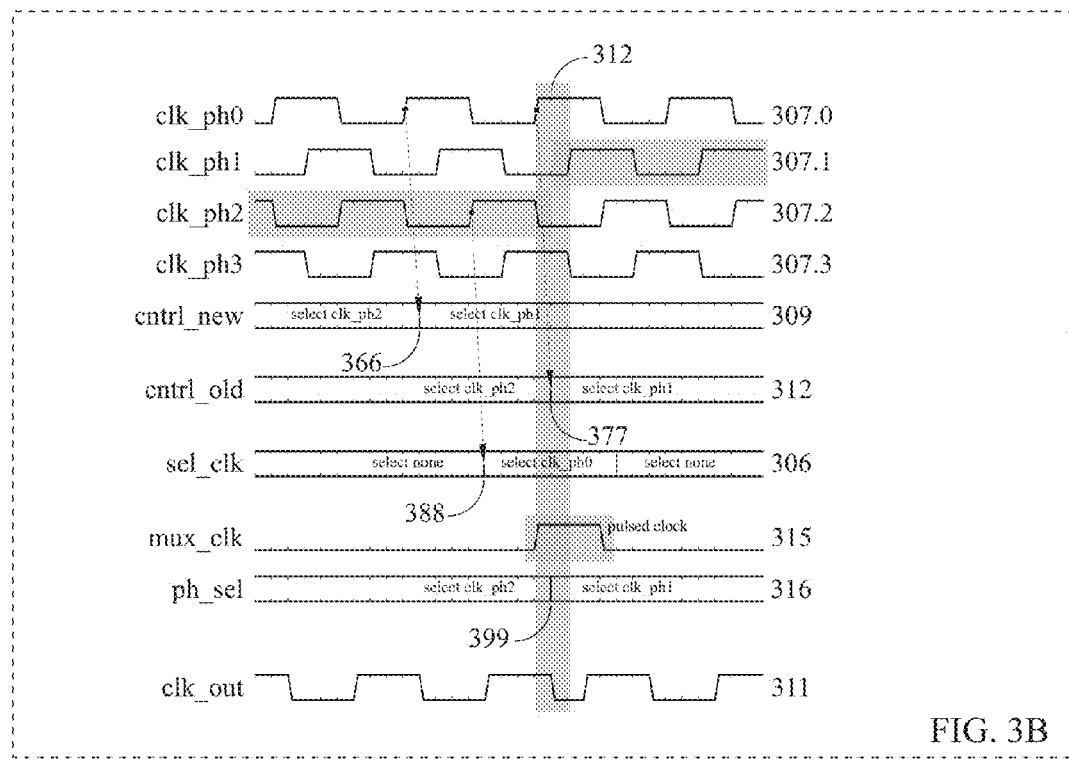

HIGH SPEED PHASE SELECTOR WITH A GLITCHLESS OUTPUT USED IN PHASE LOCKED LOOP APPLICATIONS

BACKGROUND

1. Field of Art

This disclosure generally relates to the field of digital circuit design, and more specifically to phase selectors used in phase locked loops.

2. Description of the Related Art

A phase locked loop (PLL) is a common circuit used in many clock circuits. One common use of a PLL, shown in FIG. 1A, is to take a low speed reference clock 101 and produce a high speed clock 109 whose frequency is an integral multiple R of the low speed clock. In FIG. 1A, a divider 106 divides the output clock 109 by integer R to produce a low speed clock 102. The phase frequency detector (PFD) 103 compares the low speed clock 102 to the reference clock 101. The output of PFD 103 is coupled to the input of the PLL loop filter 104. The output 108 of the loop filter 104 is coupled to the control of the VCO 105. The loop filter 104 adjusts the VCO 105 so that its frequency is closer to the desired multiple R of the input clock 102.

It is often desirable to make small, frequent, deterministic changes to the PLL output frequency to implement functions such as spread spectrum, where the high speed clock frequency is constantly varied by a small amount to reduce electromagnetic interference. FIG. 1B illustrates a phase mixer 112 that has been added to the PLL feedback path in order to implement spread spectrum. A phase mixer 112 adds small phase changes to its input clock 109, sometimes as small as 0.2% of a period, to produce its output clock 110. These small phase changes result in small frequency changes. The design and use of phase mixers for this type of application is well known in the art.

One problem with phase mixers is that they tend to use a lot of area and power and are susceptible to power supply noise induced jitter. Also, despite the fine phase resolution of the phase mixer, most of their uses in PLLs require large phase steps; the ability to take fine phase steps is not needed.

SUMMARY

The embodiments described herein relate to a phase selector that switches between N high speed clock phases without a glitch in order to advance or delay the phase of the output clock. This phase change in the clock is used in a PLL in one embodiment to implement spread spectrum. In other embodiments, other functions could be implemented, such as non-integral (fractional) divider ratios between the PLL output clock and its reference clock.

The features and advantages described in this summary and the following detailed description are not intended to be limiting. Many additional features and advantages will be apparent to one of ordinary skill in the art in view of the drawings, specification and claims.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

FIG. 3A is a detailed view of the phase selector according to one embodiment.

FIG. 3B is a waveform diagram of signals of the phase selector shown in FIG. 3A.

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. Alternative embodiments of the structures and methods illustrated herein may be employed without departing from the principles described herein.

Embodiments of the present disclosure relate to a phase selector that switches between N high speed clock phases without a glitch in order to advance or delay the phase of its output clock. The description of the technique given below will use N=4 clock phases, but other embodiments can include other values of N.

This phase change in the output clock is used in a PLL in this embodiment to implement spread spectrum. Generally, spread spectrum relates to when a signal with a particular bandwidth is spread in the frequency domain thereby resulting in a signal with a wider bandwidth. In other embodiments, other functions could be implemented, such as non-integral (fractional) divider ratios between the PLL output clock and its reference clock.

Eliminating Glitches

Figure 1A:
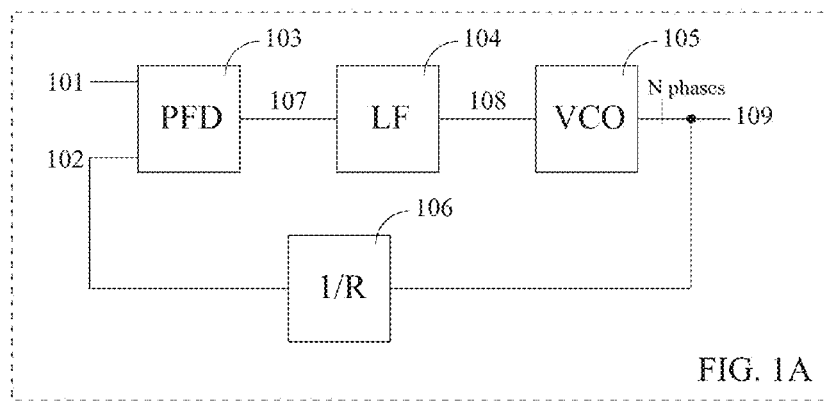
FIG. 1A illustrates a conventional PLL circuit.
Figure 1B:
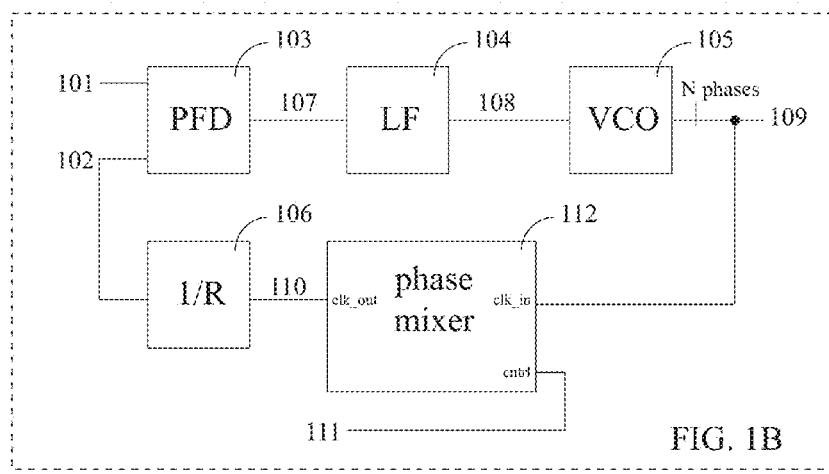
FIG. 1B illustrates a conventional PLL circuit including a phase mixer.
Figure 2A:
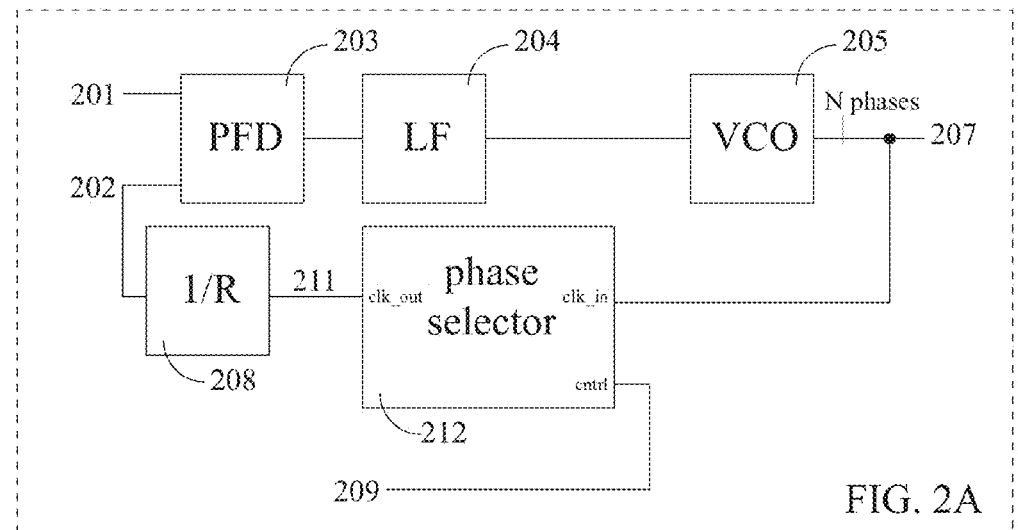
FIG. 2A illustrates a PLL circuit including a phase selector according to one embodiment.

FIG. 2A is a circuit diagram of a PLL including a phase selector 212 according to one embodiment. The PLL shown in FIG. 2A receives a low speed reference clock 201 and produces a high speed clock 207 whose frequency is an integral multiple R of the low speed clock. In FIG. 2A, block 208 divides the output clock 211 of the phase selector 212 by integer R to produce a low speed clock 202. The PFD 203 compares the low speed clock 202 to the reference clock 201. The output of PFD is coupled to the input of the PLL loop filter 204. The output of the loop filter 204 is coupled to the control of the VCO 204. The loop filter 104 adjusts the VCO 105 so that its frequency is closer to the desired multiple R of the input clock 201.

Figure 2B:
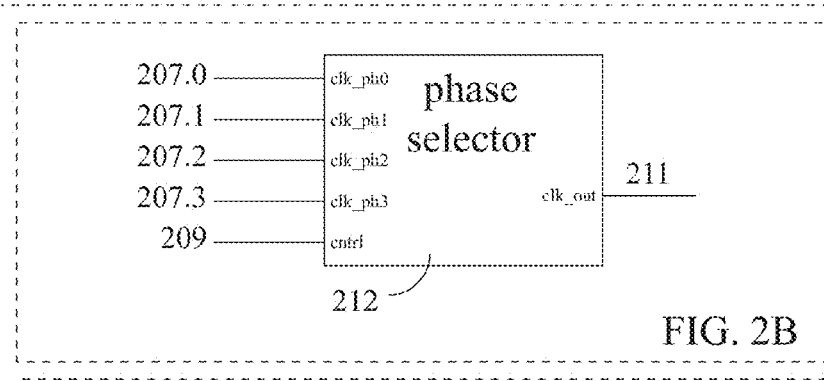
FIG. 2B illustrates the phase selector according to one embodiment.

In one embodiment, the phase selector 212, shown in FIG. 2B, is a digital circuit that uses a control signal 209 to select its clock output 211 from among N input clock phases 207. The use of the phase selector 212 in a PLL to implement functions such as spread spectrum relies on the fact that, if the phase selection can be changed frequently without any glitches, then it can be employed to change the phase of the output clock.

Figure 2C:
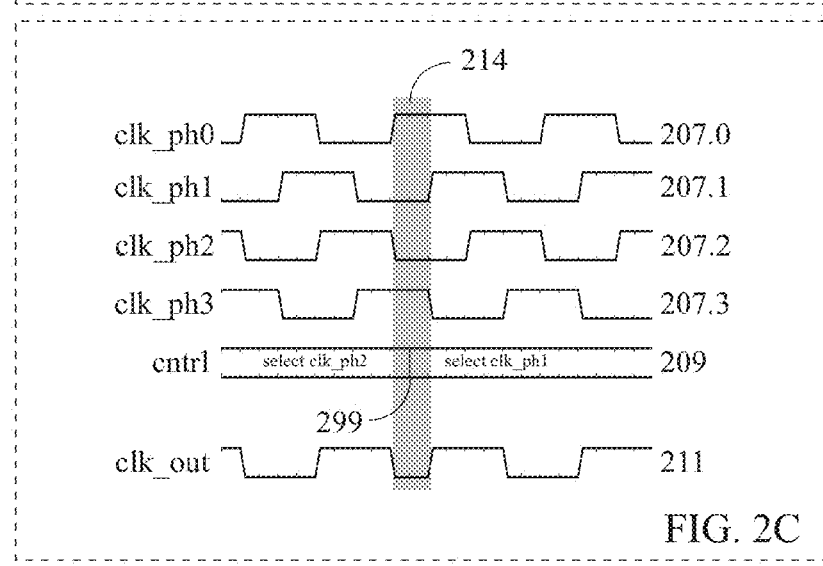
FIG. 2C is a waveform diagram of signals of the phase selector.

FIG. 2C illustrates waveform diagrams of the signals of the phase selector 212 including the phase0 clock 207.0, phase1 clock 207.1, phase2 clock 207.2, phase3 clock 207.3, control signal 209, and the output clock 211. Initially, control signal 209 is set to select phase2 clock 207.2. Thus, the clock output 211 is coupled to the phase2 clock 207.2. At time 299, the control signal 209 is changed to select phase1 clock 207.1. At that point, the clock output 211 is now coupled to the phase1 clock 207.1, causing the next rising edge of the output clock 211 to take place a quarter of a cycle earlier in time. Thus, changing the clock phase selection from phase2 clock 207.2 to phase1 clock 207.1 has shifted the phase of the output clock 211 backwards in time by a quarter of a period.

Designing a phase selector 212 that can shift between high speed clocks without a glitch over all variations in process, temperature, supply voltage, and clock frequency is challenging. Due to circuit imperfections, more than one clock phase, or no clock phase at all, might be selected for a moment in time, which can cause an incorrect output pulse (e.g., an unwanted transition from a high state to low state or vice versa), usually referred to as a glitch. The embodiments herein rely on two techniques to prevent the output of a glitch in the clock output 211. In one embodiment, the first technique is to switch from one clock phase to another only when both clock phases are low, as shown in FIG. 2C. At time 299, both phase2 clock 207.2 and phase1 clock 207.1 are both in a low state. This avoids a glitch if, for a moment, both clock phases are selected at the same time. The first technique requires circuitry to control the timing of the phase switch as will be further described below. In one embodiment, the second technique is to use a phase selector mux, shown in FIG. 5, for the final phase selection that has a zero output (i.e., a low state) when all phase select inputs are low. This will avoid a glitch if, for a moment, no clock phases are selected. By using both techniques together, the embodiments herein avoid glitches if no clock phases are selected, or if more than one clock phase is selected at one time.

The Safe Zone Technique

In one embodiment, the first technique used in implementing a glitchless phase selector is the concept of a safe zone. The safe zone describes a time period when the phase selector 212 only switches between two clock phases when both are low thereby resulting in a glitchless output even if both phase select signals are momentarily high at the same time. As shown in FIG. 2C, where the phase select signal 209 changes when clock phase2 207.2 and clock phase1 207.1 are both low during the safe zone 214.

Ensuring that the clock phase switch happens only when both phases are low is difficult to implement with high speed clocks. In one embodiment, the phase selector 212 switches between phase<N> and phase<N+1>, in either direction, a quarter period after the rising edge of phase<N−1>. As shown in FIG. 2C, the safe zone 214 for phase clock1 207.1 and phase clock2 207.2 is the quarter period after the rising edge of phase clock2 207.0.

Implementing the Safe Zone

FIG. 3A is a circuit diagram of the phase selector 212 according to one embodiment. FIG. 3B is waveform diagram of the signals of the phase selector 212 shown in FIG. 3A. The waveforms in FIG. 3B describe a transition from clock phase3 307.2 to clock phase1 307.1.

The actual clock phase switching is performed in the phase selector 212 by phase selector mux 300, shown in FIG. 3A. The phase selector mux 300 include clock phases 307 as inputs and includes four phase select lines 316. Each phase select line corresponds to a particular clock phase 307. The phase select lines 316 are coupled to the output of a phase select latch 302, whose input is coupled to the phase select code 309 and whose clock 315 is one of the clock phases. The purpose of the phase select latch 302 is to ensure that all of the phase select lines 316 load a new value at the same.

In order to select the correct clock phase as the clock 315 for the phase select latch 302, a latch mux 301 is used. The inputs of the latch mux 301 are coupled to the four clock phases 307. The output of the latch mux is coupled to the clock 315 for the phase select latch 302. In one embodiment, the latch mux 301 selects the proper clock phase 307 so that the outputs 316 of the phase select latch 302 change during the safe zone 312 shown in FIG. 3B.

The four select lines 306 for the latch mux 301 are coupled to the output of select logic 313. The select logic 313 has two sets of inputs. One set of inputs (cntrl_new) is coupled to the new phase select input 309, and the other set of inputs (cntrl_old) is coupled to the previous set of phase select inputs 312. The previous set of phase select inputs is held by flip flop 303, whose input is coupled to the new phase select input 309, and whose output is coupled to 312. Flip flop 303 is clocked by clock phase3 307.0. The select logic 313 ensures that the correct clock phase 307 is selected by latch mux 301 to latch in the new phase select code value 309 onto the phase select lines 316 during the safe zone 312.

The inputs of select logic 313 are coupled to the current phase select code 309 and a one cycle delayed version of the code (signal 312). The function implemented is to select clock phase N−1 as the clock for latch 302 when clock phases N and N+1 are being switched. When the phase select code 309 is not changing, all outputs 306 of the phase select logic 313 will be low, and thus the latch mux 301 will select none of the clocks. As a result, the phase select latch 302 is only clocked when its input has changed. This can be seen in clock signal 315 in FIG. 3B.

In FIG. 3B, the phase select control signal 309 is initially set to clock phase2 307.2. Thus, the output clock 311 is coupled to the input clock phase2 307.2 by the phase selector mux 300. At time 366, the control signal 309 is changed to select clock phase1 307.1. As a result, the output 306 of the select logic 313 goes from selecting no clock phase to selecting clock phase0 at time 388 as described with respect to FIG. 4. This causes the latch mux 301 to couple clock phase0 307.0 to its output 315. When clock 315 goes high, latch 302 latches in the new control value 309 onto the select lines 316 of the phase selector mux 300. This latching starts at the beginning of the safe zone 312 at time 399 when both the old clock phase2 (307.2) and the new clock phase1 (307.1) are low. Once the switch takes place, the output 311 is now coupled to input clock phase1 307.1, and the next rising edge has moved backward in time by a quarter of a clock cycle. After one clock cycle of 307.0, the previous phase select control signal 312 is now equal to the current phase select signal 309, and the latch mux select control 306 goes back to selecting no clocks.

Figure 4:
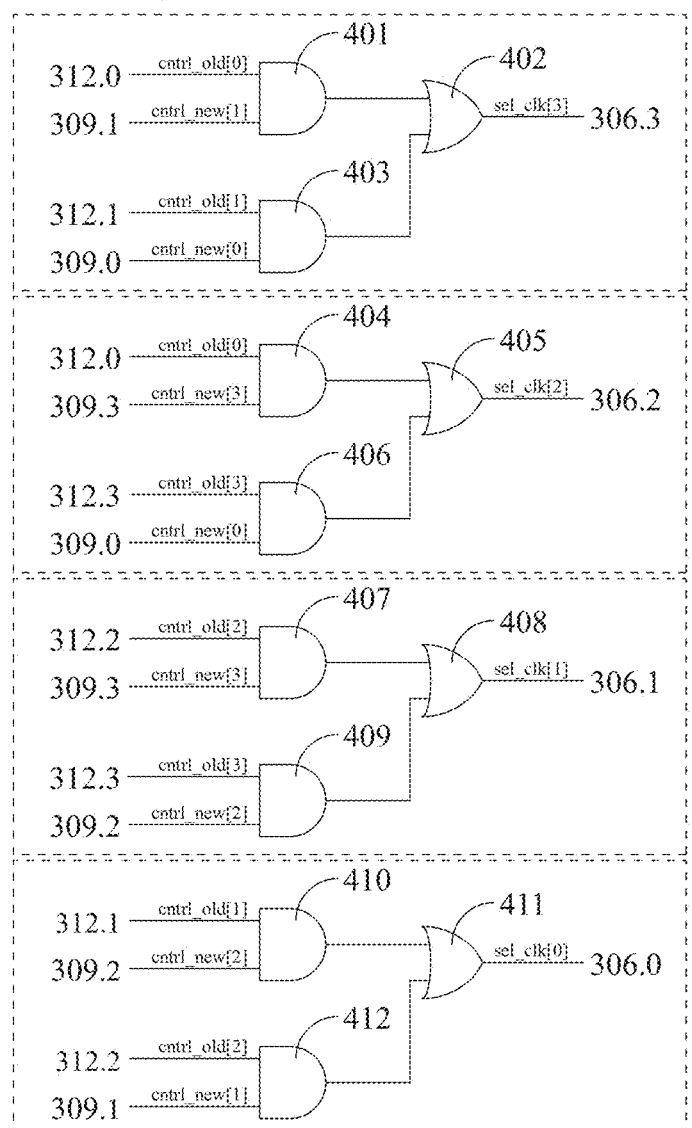
FIG. 4 illustrates a detailed view of a select logic of the phase selector according to one embodiment.

FIG. 4 is detailed view of the select logic 313 according to one embodiment. As described above, the select logic 313 calculates which clock phase will be used to latch in the new phase select lines. In FIG. 4, each of the four select lines 306 is coupled to the output of an OR gate, and each OR gate's inputs are coupled to the output of an AND gate. For output 0 (signal 306.0), the inputs of AND gate 410 is coupled to the old (previous) control bit for input clock 1 (312.1) and the new (current) control bit for input clock 2 (309.2). The inputs of AND gate 412 is coupled to the old (previous) control bit for input clock 2 (312.2) and the new (current) control bit for input clock 1 (309.1). OR gate 411 then logically ORs the outputs of these two AND gates together, producing output 306.0. As a result, output 0 (signal 306.0) goes high if we switch from clock phase1 to clock phase2 or from clock phase2 to clock phase1. The remaining 3 outputs of select block 313 use a similar method to select the inputs for their AND gates. The function implemented is to select N−1 when clock phases N and N+1 are being switched.

This safe zone technique works whether the phase of the output clock is moving forward or backwards in time. In this embodiment of the phase selector, the phase selector only switches from one phase to an adjacent (before or afterwards) phase. Other embodiments can implement larger phase steps with additional control circuitry.

Design of the Final Clock Mux

Figure 5:
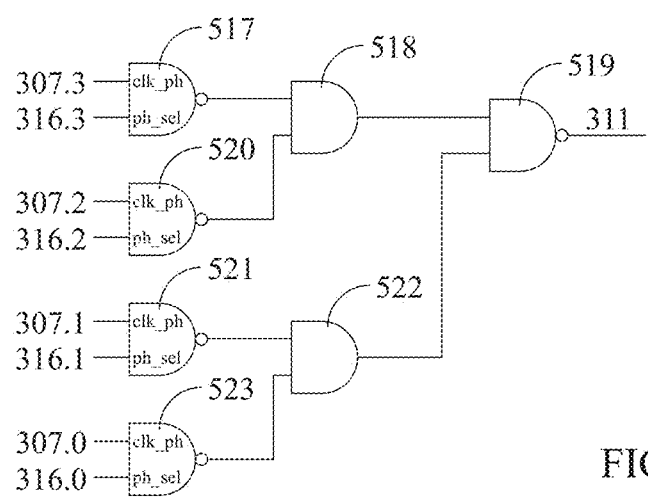
FIG. 5 illustrates a detailed view of a phase selector mux of the phase selector according to one embodiment.

The safe zone technique prevents a glitch of the phase selector output if both select lines of the phase selector mux 300 are high at the same time. However, if both select lines are low at the same time, a different technique is needed to prevent a glitch in the clock output. FIG. 5 is a circuit diagram of the phase selector mux 300 according to one embodiment that prevents a glitch in the clock output if both select lines are low at the same time. In the embodiment shown in FIG. 5, the output of the phase selector mux 300 is low if no inputs are selected.

In FIG. 5, the clock output 311 is coupled to the output of a NAND gate 519 whose inputs are coupled to two AND gates 518 and 522. The 4 inputs of these AND gates are coupled to the outputs of four NAND gates 517, 520, 521, and 523. Each of these NAND gates has one input coupled to a particular phase clock 307, and the other input coupled to a particular select signal 316. If a select signal 316 is high, then the corresponding clock signal is coupled to the NAND output, and then to the AND gate output, to the final NAND gate 519 output 311. If a select signal 316 is low, the output of its NAND gate is set high, which causes the AND gate to act as a pass gate for its other input. If all select inputs 316 are low, then the output 311 is low.

Optimization of the Latch Mux

Figure 6:
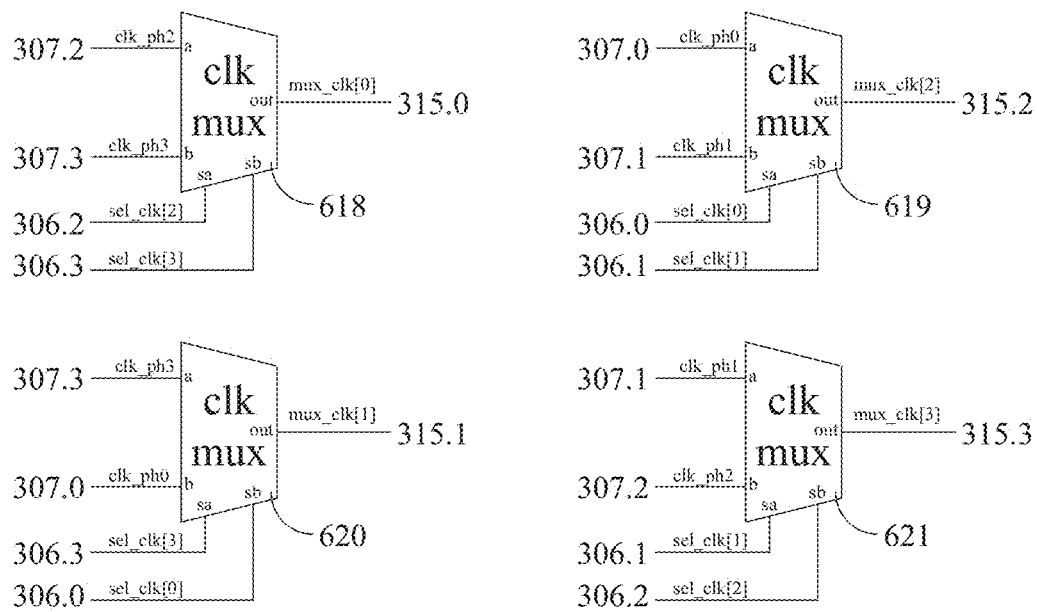
FIG. 6 illustrates a detailed view of the latch mux of the phase selector according to one embodiment.

The latch mux 301 in FIG. 3A selects one of the four clocks as the clock 315 for the latch 302. In one embodiment of the latch mux 301, the latch mux can be optimized from one 4 input mux to four 2 input muxes as shown in FIG. 6. This is done to reduce the power and latency of the latch mux because, in general, 2 input muxes are much faster and lower in power than a 4 input mux. In FIG. 6, the circuit consists of four 2-input muxes. The output of each mux is coupled to one of the outputs 315. The mux inputs are coupled to 2 different clock phases 307, and its select inputs are coupled to the corresponding clock select signals 306. For example, the output of mux 618 is coupled to output 315.0, its inputs are coupled to clock phases 2 and 3 (307.2 and 307.3), and its select inputs are coupled to the select signals for clock phases 2 and 3 (306.2 and 306.3). The other three 2-input muxes are connected in a similar fashion.

Each of the four individual latches in latch 302 has its own clock, which is coupled to the output of one of the four 2-input muxes (618, 619, 620, 621) that make up the latch mux 301.

The optimization relies on the fact that for any of the four latch clocks, there are only two possible input clock phases to choose from as the correct clock. For a latch bit N, either it is being switched with N+1, in which case input clock phase N−1 should be used to latch in the new phase select bit; or N is being switched with N−1, in which case input clock phase N−2 should be used to latch in the new phase select bits. Thus, it is only necessary to select between 2 clocks, not 4, to choose an input clock phase to clock a given latch. For example, in FIG. 6, signal 315.2 (the clock for bit #N=2 of the latch 302) can be either 307.0 (phase N−2=0) or 307.1 (phase N−1=1).

Computing Machine Architecture

Figure 7:
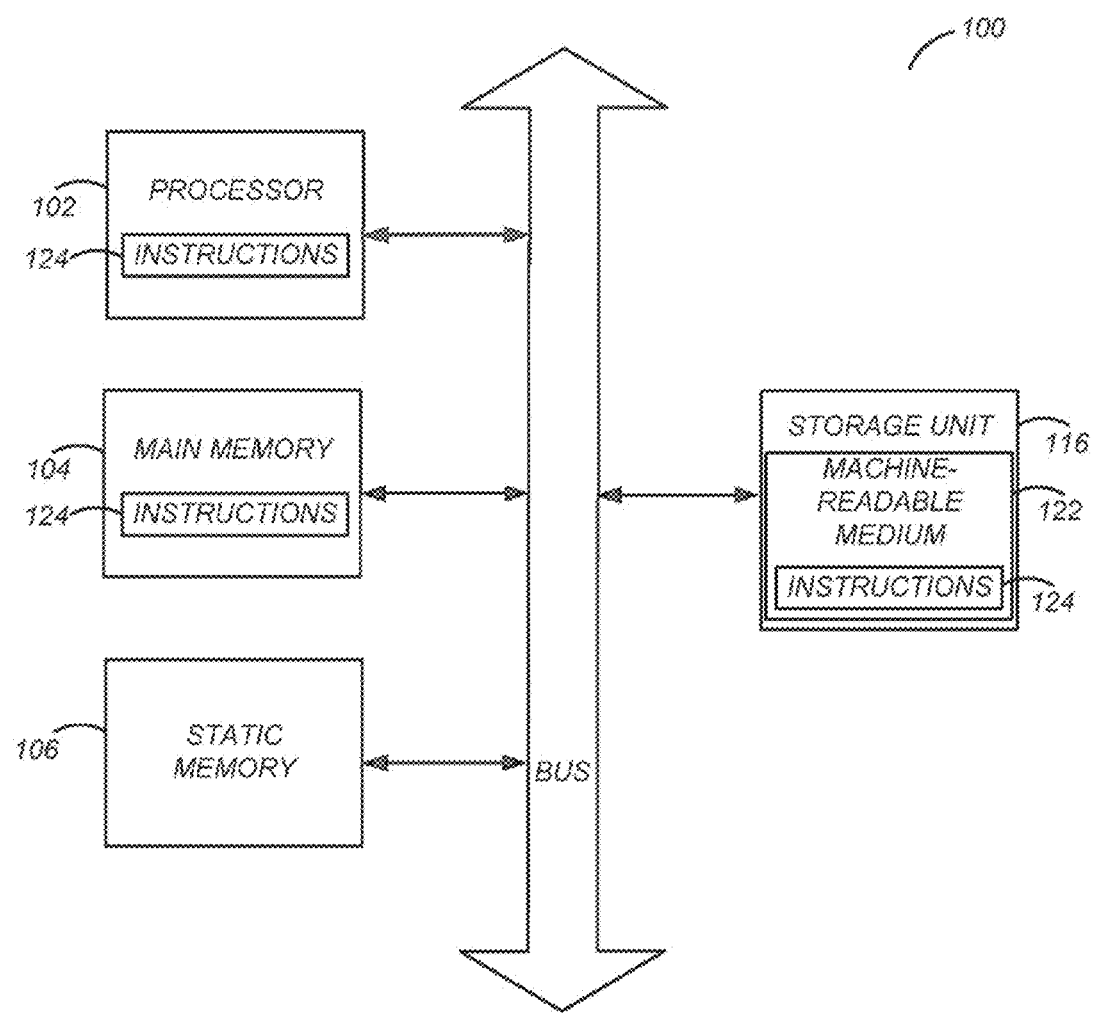
FIG. 7 is a diagram of a computing device according to one embodiment.

FIG. 7 is a block diagram illustrating components of computing device able to read instructions from a non-transitory computer-readable strorage medium and execute them in a processor (or controller). Specifically, FIG. 7 shows a diagrammatic representation of a computing device in the example form of a computer system 100 within which instructions 124 (e.g., software) for causing the computing device to perform any one or more of the methodologies discussed herein may be executed. In alternative embodiments, the computing device operates as a standalone device or may be connected (e.g., networked) to other machines. In a networked deployment, the machine may operate in the capacity of a server machine or a client machine in a server-client network environment, or as a peer machine in a peer-to-peer (or distributed) network environment.

The computing device may be a server computer, a client computer, a personal computer (PC), or any computing device capable of executing instructions 124 (sequential or otherwise) that specify actions to be taken by that machine. Further, while only a single computing device is illustrated, the term "computing device" shall also be taken to include any collection of computing device that individually or jointly execute instructions 124 to perform any one or more of the methodologies discussed herein.

The example computer system 100 includes a processor 102 (e.g., a central processing unit (CPU), a graphics processing unit (GPU), a digital signal processor (DSP), one or more application specific integrated circuits (ASICs), a main memory 104, a static memory 106, and a storage unit 116 which are configured to communicate with each other via a bus 108. The storage unit 116 includes a machine-readable medium 122 on which is stored instructions 124 (e.g., software) embodying any one or more of the methodologies or functions described herein. The instructions 124 (e.g., software) may also reside, completely or at least partially, within the main memory 104 or within the processor 102 (e.g., within a processor's cache memory) during execution thereof by the computer system 100, the main memory 104 and the processor 102 also constituting machine-readable media.

While machine-readable medium 122 is shown in an example embodiment to be a single medium, the term "machine-readable medium" should be taken to include a single medium or multiple media (e.g., a centralized or distributed database, or associated caches and servers) able to store instructions (e.g., instructions 124). The term "machine-readable medium" shall also be taken to include any medium that is capable of storing instructions (e.g., instructions 124) for execution by the machine and that cause the machine to perform any one or more of the methodologies disclosed herein. The term "machine-readable medium" includes, but not be limited to, data repositories in the form of solid-state memories, optical media, and magnetic media.

Overview of EDA Design Flow

Figure 8:
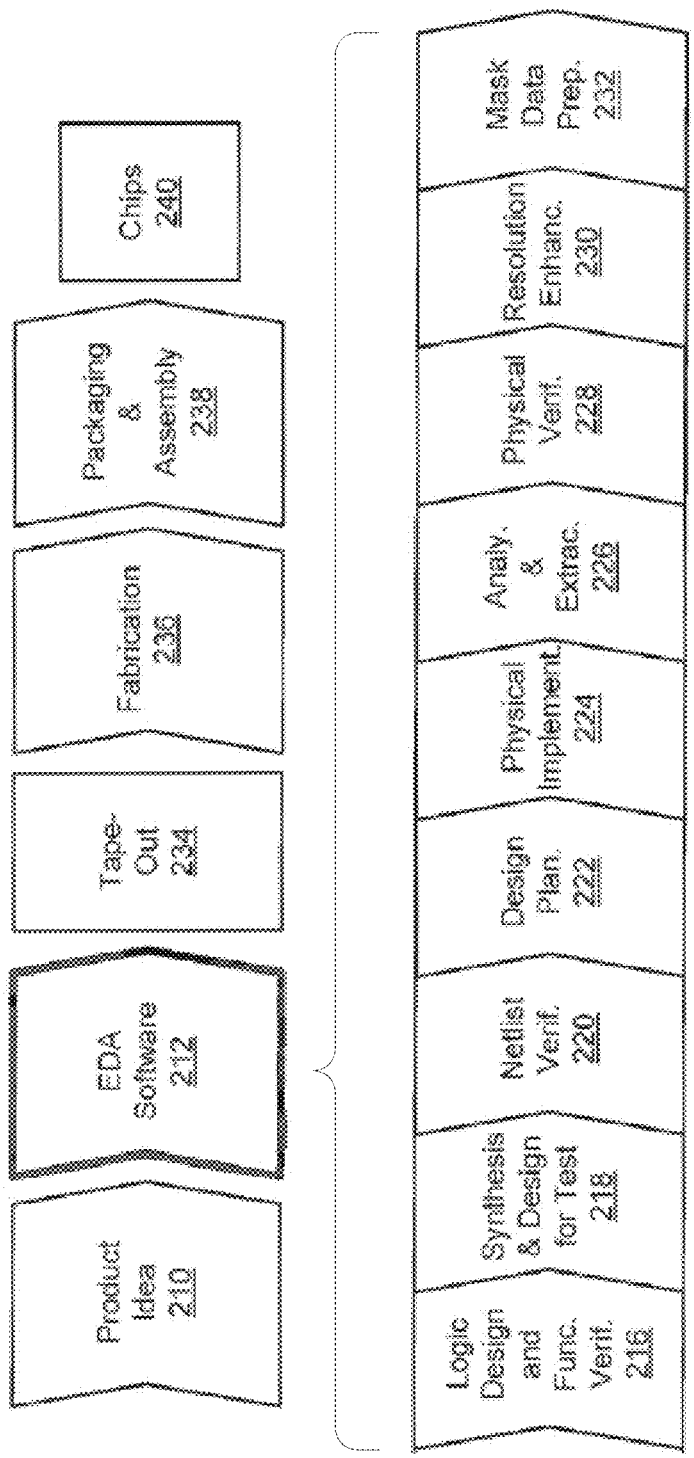
FIG. 8 is a simplified representation of an exemplary digital design flow according to one embodiment.

FIG. 8 is a flowchart 200 illustrating the various operations in the design and fabrication of an integrated circuit. This process starts with the generation of a product idea 210, which is realized during a design process that uses electronic design automation (EDA) software 212. When the design is finalized, it can be taped-out 234. After tape-out, a semiconductor die is fabricated 236 to form the various objects (e.g., gates, metal layers, vias) in the integrated circuit design. Packaging and assembly processes 238 are performed, which result in finished chips 240.

The EDA software 212 may be implemented in one or more computing devices such as the computer 100 of FIG. 7. For example, the EDA software 212 is stored as instructions in the computer-readable medium which are executed by a processor for performing operations 214-232 of the design flow, which are described below. This design flow description is for illustration purposes. In particular, this description is not meant to limit the present disclosure. For example, an actual integrated circuit design may require a designer to perform the design operations in a difference sequence than the sequence described herein.

During system design 214, designers describe the functionality to implement. They can also perform what-if planning to refine the functionality and to check costs. Note that hardware-software architecture partitioning can occur at this stage. Example EDA software products from Synopsys, Inc. of Mountain View, Calif. that can be used at this stage include: Model Architect®, Saber®, System Studio®, and Designware® products.

During logic design and functional verification 216, VHDL or Verilog code for modules in the circuit is written and the design is checked for functional accuracy. More specifically, the design is checked to ensure that it produces the correct outputs. Example EDA software products from Synopsys, Inc. of Mountain View, Calif. that can be used at this stage include: VCS®, Vera®, 10 Designware®, Magellan®, Formality®, ESP® and Leda® products.

During synthesis and design for test 218, VHDL/Verilog is translated to a netlist. This netlist can be optimized for the target technology. Additionally, tests can be designed and implemented to check the finished chips. Example EDA software products from Synopsys, Inc. of Mountain View, Calif. that can be used at this stage include: Design Compiler®, Physical Compiler®, Test Compiler®, Power Compiler®, FPGA Compiler®, Tetramax®, and Designware® products.

During netlist verification 220, the netlist is checked for compliance with timing constraints and for correspondence with the VHDL/Verilog source code. Example EDA software products from Synopsys, Inc. of Mountain View, Calif. that can be used at this stage include: Formality®, Primetime®, and VCS® products.

During design planning 222, an overall floor plan for the chip is constructed and analyzed for timing and top-level routing. Example EDA software products from Synopsys, Inc. of Mountain View, Calif. that can be used at this stage include: Astro® and IC Compiler® products.

During physical implementation 224, the placement (positioning of circuit elements) and routing (connection of the same) occurs. Example EDA software products from Synopsys, Inc. of Mountain View, Calif. that can be used at this stage include: the Astro® and IC Compiler® products.

During analysis and extraction 226, the circuit function is verified at a transistor level, which permits refinement. Example EDA software products from Synopsys, Inc. of Mountain View, Calif. that can be used at this stage include: Astrorail®, Primerail®, Primetime®, and Star RC/XT® products.

During physical verification 228, the design is checked to ensure correctness for: manufacturing, electrical issues, lithographic issues, and circuitry. Example EDA software products from Synopsys, Inc. of Mountain View, Calif. that can be used at this stage include the Hercules® product.

During resolution enhancement 230, geometric manipulations of the layout are performed to improve manufacturability of the design. Example EDA software products from Synopsys, Inc. of Mountain View, Calif. that can be used at this stage include: Proteus®, Proteus®AF, and PSMGED® products.

During mask-data preparation 232, the 'tape-out' data for production of masks to produce finished chips is provided. Example EDA software products from Synopsys, Inc. of Mountain View, Calif. that can be used at this stage include the CATS® family of products.

Embodiments of the present disclosure can be used during one or more of the above-described stages. Specifically, in some embodiments the present disclosure can be used in EDA software 212 that includes operations between design planning 222 and physical implementation 224.

Additional Configuration Considerations

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

The various operations of example methods described herein, such as those performed by the compiler, may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to improve the clarity of this disclosure. This description should be read to include one or at least one and the singular also includes the plural unless it is obvious that it is meant otherwise.

Upon reading this disclosure, those of skill in the art will appreciate still additional alternative structural and functional designs for a system for improved pin routing through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

Upon reading this disclosure, those of skill in the art will appreciate still additional alternative structural and functional designs for a fractional divider using the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

Upon reading this disclosure, those of skill in the art will appreciate still additional alternative structural and functional designs for a phase selector using the disclosed principles herein. Thus, while particular embodiments and applications have been illustrated and described, it is to be understood that the disclosed embodiments are not limited to the precise construction and components disclosed herein. Various modifications, changes, and variations, which will be apparent to those skilled in the art, may be made in the arrangement, operation and details of the method and apparatus disclosed herein without departing from the spirit and scope defined in the appended claims.

What is claimed is:

1. A digital phase selector circuit comprising:
   a plurality of clock phase inputs, each of the plurality of clock phase inputs configured to receive one of a plurality of distinct clock phases, each of the plurality of distinct clock phases alternating between a high state and a low state;
   a plurality of control signal inputs each configured to receive one of a plurality of control signals, each control signal selecting one of the plurality of distinct clock phases to output by the digital phase selector circuit; and
   a clock output configured to output a clock signal without a glitch based on the plurality of control signals;
   wherein the digital phase selector circuit is configured to output the clock signal without the glitch by transitioning from outputting a first clock phase from the plurality of distinct clock phases as the clock signal to outputting a second clock phase from the plurality of distinct clock phases as the clock signal when both the first clock phase and the second clock phase are in the low state.

2. The digital phase selector circuit of claim 1, wherein the digital phase selector circuit is further configured to output the clock signal in the low state responsive to the plurality of control signals simultaneously being in the low state.

3. The digital phase selector circuit of claim 1, wherein the glitch is an incorrect state in the clock signal responsive to more than one of the plurality of distinct clock phases simultaneously being selected as the clock signal.

4. The digital phase selector circuit of claim 1, wherein the glitch is an incorrect state in the clock signal responsive to none of the plurality of distinct clock phases being selected as the outputted clock signal.

5. The digital phase selector circuit of claim 1, further comprising:
   a control logic configured to receive the plurality of control signals that are each associated with one of the plurality of distinct clock phases and a delayed version of the plurality of control signals, and configured to output at least one select clock signal based on the plurality of control signals and the delayed version of the plurality of control signals, at least one select clock signal indicating a first clock phase responsive to the plurality of control signals indicating a transition between a second clock phase and a third clock phase;
   a latch mux configured to receive the plurality of distinct clock phases and the at least one select control signal indicating the first clock phase, and configured to output the first clock phase based on the at least one select control signal;
a latch configured to receive the plurality of control signals and the first clock phase, and the latch configured to output the plurality of control signals based on the first clock phase; and
a phase selector mux configured to receive the plurality of distinct clock phases and the plurality of control signals and configured to output one of the plurality of distinct clock phases as the clock signal based on the plurality of control signals, the phase selector mux configured to output a clock signal with the low state responsive to the plurality of control signals being in the low state.

6. The digital phase selector circuit of claim 5, wherein the control logic comprises:
a plurality of AND gates, each AND gate including a pair of inputs and an output, each input coupled to either one of the plurality of control signals or the delayed version of one of the plurality of control signals; and
an OR gate including a pair of inputs, each input coupled to the output of one of the plurality of AND gates, the OR gate configured to output the at least one select clock signal based on outputs of the plurality of AND gates.

7. The digital phase selector circuit of claim 5, wherein the phase selector mux comprises:
a plurality of first NAND gates, each first NAND gate including a pair of inputs and an output, each input coupled to one of the plurality of distinct clock phases and one of the plurality of control signals;
a plurality of AND gates, each AND gate including a pair of inputs and an output, each input coupled to the output of one of the plurality of first NAND gates; and
a second NAND gate including a pair of inputs and an output, each input coupled to an output of one of the plurality of AND gates, the second NAND gate configured to output the clock signal based on the outputs of the plurality of AND gates.

8. A non-transitory computer readable storage medium storing a representation of a digital phase selector circuit, the digital phase selector circuit comprising:
a plurality of clock phase inputs, each of the plurality of clock phase inputs configured to receive one of a plurality of distinct clock phases, each of the plurality of distinct clock phases alternating between a high state and a low state;
a plurality of control signal inputs each configured to receive one of a plurality of control signals, each control signal selecting one of the plurality of distinct clock phases to output by the digital phase selector circuit; and
a clock output configured to output a clock signal without a glitch based on the plurality of control signals;
wherein the digital phase selector circuit is configured to output the clock signal without the glitch by transitioning from outputting a first clock phase from the plurality of distinct clock phases as the clock signal to outputting a second clock phase from the plurality of distinct clock phases as the clock signal when both the first clock phase and the second clock phase are in a low state.

9. The non-transitory computer-readable storage medium of claim 8, wherein the clock signal is outputted in the low state responsive to the plurality of control signals simultaneously being in the low state.

10. The non-transitory computer-readable storage medium of claim 8, wherein the glitch is an incorrect pulse in the outputted clock signal responsive to more than one of the plurality of distinct clock phases simultaneously being selected as the outputted clock signal.

11. The non-transitory computer-readable storage medium of claim 8, wherein the glitch is an incorrect pulse in the outputted clock signal responsive to none of the plurality of distinct clock phases being selected as the outputted clock signal.

12. The non-transitory computer-readable storage medium of claim 8, wherein the digital phase selector circuit further comprises:
a control logic configured to receive the plurality of control signals that are each associated with one of the plurality of distinct clock phases and a delayed version of the plurality of control signals, and configured to output at least one select clock signal based on the plurality of control signals and the delayed version of the plurality of control signals, at least one select clock signal indicating a first clock phase responsive to the plurality of control signals indicating a transition between a second clock phase and a third clock phase;
a latch mux configured to receive the plurality of distinct clock phases and the at least one select control signal indicating the first clock phase, and configured to output the first clock phase based on the at least one select control signal;
a latch configured to receive the plurality of control signals and the first clock phase, and the latch configured to output the plurality of control signals based on the first clock phase; and
a phase selector mux configured to receive the plurality of distinct clock phases and the plurality of control signals and configured to output one of the plurality of distinct clock phases as the clock signal based on the plurality of control signals, the phase selector mux configured to output a clock signal with a low state responsive to the plurality of control signals being in a low state.

13. The non-transitory computer-readable storage medium of claim 12, wherein the control logic comprises:
a plurality of AND gates, each AND gate including a pair of inputs and an output, each input coupled to either one of the plurality of control signals or the delayed version of one of the plurality of control signals; and
an OR gate including a pair of inputs, each input coupled to the output of one of the plurality of AND gates, the OR gate configured to output the at least one select clock signal based on outputs of the plurality of AND gates.

14. The non-transitory computer-readable storage medium of claim 12, wherein the phase selector mux comprises:
a plurality of first NAND gates, each first NAND gate including a pair of inputs and an output, each input coupled to one of the plurality of distinct clock phases and one of the plurality of control signals;
a plurality of AND gates, each AND gate including a pair of inputs and an output, each input coupled to the output of one of the plurality of first NAND gates; and
a second NAND gate including a pair of inputs and an output, each input coupled to an output of one of the plurality of AND gates, the second NAND gate configured to output the clock signal based on the outputs of the plurality of AND gates.

* * * * *